United States Patent

[11] 3,603,716

[72] Inventors Heiman W. Koren
Huntington, N.Y.;
Nicolas Worontzoff, Islip Terrace, N.Y.;
Kenneth Siegel, deceased, late of Old Bethpage, N.Y. (Bernice Siegel, executrix);
Yehuda Klinger, Huntington, N.Y.

[21] Appl. No. 845,119

[22] Filed June 27, 1969

[45] Patented Sept. 7, 1971

[73] Assignee The United States of America as represented by the Secretary of the Army

[54] SUPERCONDUCTING R.F. RADIATION SHIELD FOR HIGH Q CIRCUITS

8 Claims, 3 Drawing Figs.

[52] U.S. Cl. .................................................. 174/35 TS, 29/599, 174/35 MS, 313/313, 325/357

[51] Int. Cl. .................................................. H05k 9/00

[50] Field of Search .................................................. 174/35, 35.5, 35.4; 313/312, 313; 325/357; 335/216; 336/250, 208; 29/599; 340/173.1

[56] References Cited

UNITED STATES PATENTS 2,860,328 11/1958 Langworthy .................. 174/35 (.5) X

*Primary Examiner*—Darrell L. Clay

*Attorneys*—Harry M. Saragovitz, Edward J. Kelly, Herbert Berl and Jess J. Smith, Jr.

ABSTRACT: This invention relates to a superconducting R.F. radiation shield and method of constructing said shield. The shield structure is fabricated by wrapping a superconducting ribbon around a cylindrical form with an approximately 50 percent overlap. A thin Teflon tape is employed to insulate successive turns of the ribbon. End plugs may be provided by placing a flat sheet of Teflon across each end covered by a wide sheet of superconducting foil thereby providing an improved R.F. radiation shield for enclosing a superconducting circuit.

INVENTORS,
HEIMAN W. KOREN
NICOLAS WORONTZOFF
KENNETH SIEGEL
YEHUDA KLINGER

BY Harry M. Saragovitz, AGENT.
Edward J. Kelly & Herbert Berl ATTORNEYS.

SUPERCONDUCTING R.F. RADIATION SHIELD FOR HIGH Q CIRCUITS

BACKGROUND OF THE INVENTION

This invention relates to radio frequency radiation shields similar to those employed heretofore and known as RF shields or cans, but employing a novel structure and construction techniques. In order to obtain a high Q in superconducting RF circuits a radiation shield is required. It is extremely difficult, and hence costly, to fabricate a suitable shield of superconducting material of the size required to contain an RF Circuit, for example, a superconducting circuit containing various inductive-capacitive elements. It has been found that a suitably sized and relatively inexpensive shield structure can be fabricated by winding or wrapping commercially available superconducting ribbon, niobium stannide for example, around a suitable form thereby producing a radiation shield.

Superconducting shields heretofore constructed have generally been of either the type wherein a superconducting fluid filled chamber surrounds the device, instrument or object to be shielded, or of the type formed from a single continuous sheet and fabricated in the form of a cylinder or other suitable shape. The filled chamber type shield is generally employed in relatively large installations, e.g., shielding a manned space capsule whereas a shield fabricated from a continuous sheet of superconducting material is limited, generally, to shields of a relatively small size due to the difficulty encountered in manufacturing large sheets of the superconducting material.

SUMMARY OF THE INVENTION

Broadly, this invention relates to a method and means for producing a radio frequency shield. More specifically, it relates to a method and device for producing a particularly high Q in superconducting RF circuits by providing a novel radiation shield surrounding said superconducting circuits. The radiation shield is formed by winding a superconducting ribbon about a dielectric form of cylindrical or other shape. Insulation is provided between successive turns and the ribbon is so wound or wrapped as to overlap the preceding turn by approximately 50 percent thereby insuring effective shielding. By insulating the overlapping turns of ribbon the tendency of the otherwise contacting overlapping ribbons to form local RF voltages or current concentrations that would tend to destroy superconductivity is overcome. That is, the possible high currents across point contacts (and consequent local temperature and magnetic effects) might cause the superconductors to go normal with a return of resistance and consequent loss of the desirable shielding effect. Providing insulation between turns also tends to lower the natural resonant frequency of the shield thereby increasing the difference between the operating frequency of the shielded circuit and the natural frequency of the shield itself.

End plugs across the open ends of the cylinder or selected form tend to exclude undesirable fields while retaining RF energy of the enclosed superconducting circuit that would otherwise give a power loss and reduction in Q.

It is the object of this invention to provide a shielding structure for high Q superconducting circuits. It is a further object of this invention to provide a method of constructing a shielding structure that is suitable for use at superconducting temperatures as well as room temperatures.

BRIEF DESCRIPTION OF THE DRAWING

The exact nature of this invention as well as the other advantages and objects will be readily apparent from consideration of the specification relating to the annexed drawing in which.

DESCRIPTION OF THE PREFERRED EMBODIMENT

Figure 1:
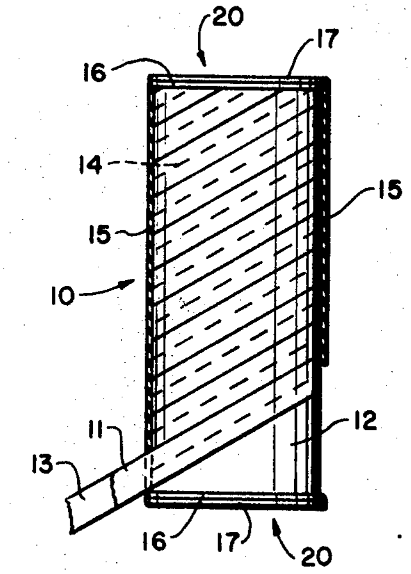
FIG. 1 is a side view of the RF shield of the instant invention showing end plugs mounted and the overlapped ribbon in dashed lines.

Referring now to the drawings wherein like reference characters designate like or corresponding parts throughout the views, there is shown in FIG. 1 a shield structure 10 having superconducting ribbons wound around around Teflon cylinder 12 within which a superconducting circuit (not shown) may be positioned for operation. In the shield structure 10 actually constructed, cylinder 12 was 5 inches in diameter and 10 inches long although other shapes and sizes may be employed with predictable results. The superconducting circuit to be shielded (not shown) was approximately 3 inches in diameter and 2½ inches long and was operated at 28 MHz. Superconducting ribbon 11 is wound around the cylinder 12 with approximately a 50 percent overlap as shown in FIG. 1 by the dotted lines 14. A 2 mil ribbon or strip 13 of Teflon was likewise wound around the cylinder 12 to prevent electrical connection between successive turns. The full length of the cylinder 12 is covered by the 2.4 inch wide ribbon 11 of niobium stannide although ribbons of other size and suitable superconductivity may be employed. After the ribbon 11 and layer 13 has been wound onto the cylinder 12, the full 10 inch length was covered with and wrapped by a single 2 mil layer of Teflon roll 15. The ends of the shield structure were then sealed by successive layers of Teflon sheets 16 and by wide sheets of superconducting foil 17 forming end plugs 20.

Figure 2:
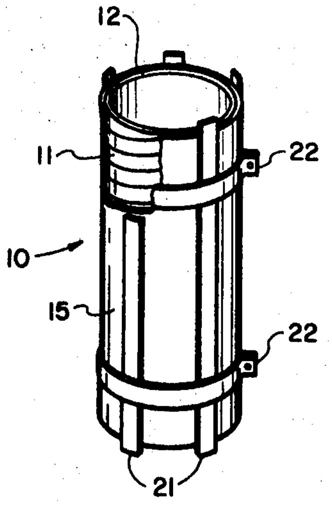
FIG. 2 is a perspective view of the RF shield with clamps attached.

Referring now to FIG. 2 there is shown the shield structure 10 with end plugs 20 removed. After the Teflon roll 15 has been wrapped around the structure 10, five 2.4 inch vertical strips 21 (only two such strips shown in FIG. 2) of niobium stannide were equally spaced around the circumference of the structure 10. Strips 21 are employed to electrically connect the end plugs 20 with each other thereby keeping the electric fields at the ends low. Teflon clamps 22 are employed to provide tight clamping of the strips 21 thereby keeping the capacitance of the vertical strips 21 high and the resonant frequency of the structure 10 low.

Although cylinder 12 has been described as being fabricated of Teflon, other suitable forms may be employed including aluminum oxide. Various types of cooling may be employed including liquid helium, helium vapor, or other suitable coolants or cooling means.

Figure 3:
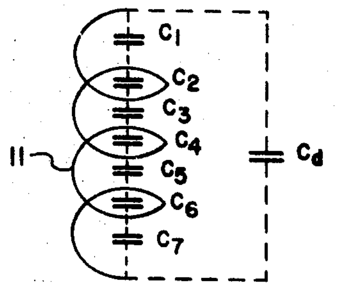
FIG. 3 shows the electrical characteristics of the shield as essentially a coil having individual capacitance between each turn or layer.

There is shown in FIG. 3 the electrical characteristics of the shield with ribbon 11 being shown as a coil with various capacitors $C_1$–$C_7$ between successive turns. The individual capacitors $C_1$–$C_7$ are relatively large and sum to a large distributive capacitance $Cd$ across the coil. While the inductance of the coil is not large, $Cd$ and the coil would resonate several MHz. below that of the shielded circuit (not shown) to be placed inside the shield structure 10. It is desired that the shielded circuit (not shown) be operated at a frequency that is far removed from shield 10 resonance to minimize shield current and therefore minimize losses that would tend to destroy superconductivity.

The self resonant frequency of the shield 10 actually constructed was measured to be 2.4 MHz. This is adequately low compared with the operating frequency of 28 MHz. for the circuit intended to be shielded. With the shield 10 as disclosed above, a circuit Q of 2.8 million was measured at 4.2° K., 1 million at 11° K., and greater than 400,000 at 15° K. The decrease of Q with temperature appeared to be due to the quality of the superconducting ribbon 11 rather than the shield fabrication or design.

It should be noted that the method of construction disclosed herein as well as the shield itself is also novel at room temperatures and might be useful in that environment.

Further, it should be noted that the improved radiation shield herein disclosed may be constructed without the use of electrical insulation with measurable results.

It should be understood, of course, that the foregoing disclosure relates to only a preferred embodiment(s) of the invention and that numerous modifications or alterations may be made therein without departing from the spirit and scope of the invention as set forth in the appended claims.

What is claimed is:

1. A method of constructing a radiation shield structure comprising the steps of:
   wrapping an electrically conductive ribbon about a hollow dielectric form of cylindrical shape with open ends;
   overlapping successive turns of said ribbon so as to insure substantially continuous coverage of said form;
   insulating said overlapped turns from each successive turn so as to prevent electrical contact therebetween;
   sealing said open ends of said hollow cylinder with first a dielectric material and subsequently a material of like composition as said ribbon, thereby providing an improved radiation shield capable of shielding a device placed within said hollow portion of said cylinder.

2. The method of constructing a radiation shield structure according to claim 1 and further comprising the step of:
   electrically connecting said end materials that are of like composition as said ribbon; and
   insulating said ribbon from said electrical connection between said end materials.

3. The method of constructing a radiation shield structure according to claim 1 and further comprising the step of:
   providing a superconducting environment for said shield.

4. The method of constructing a radiation shield structure according to claim 2 and further comprising the step of:
   providing a superconducting environment for said shield.

5. A method of fabricating a radiation shield comprising the steps of:
   wrapping an electrically conductive ribbon about a hollow dielectric form having open ends so as to form successive turns;
   insulating said successive turns so as to prevent electrical contact therebetween;
   sealing said open ends by means of an electrical insulation and an electrically conductive material of like composition as said ribbon;
   electrically connecting said ribbonlike material that seals said open ends;
   electrically insulating said end seals from said wrapped ribbon, and;
   providing a superconducting environment for said shield thereby producing an improved radiation shield that is capable of shielding a high Q circuit placed inside said hollow dielectric form.

6. An improved radiation shield comprising:
   a hollow dielectric form having open ends;
   an electrically conductive ribbon means helically wound about said dielectric form so as to substantially surround said form;
   means sealing said open ends;
   means electrically connecting said end sealing means, and;
   means insulating said wound ribbon means from said end sealing means thereby producing an improved radiation shield.

7. The improved radiation shield according to claim 6, and further comprising that:
   said ribbon means and said end sealing means are superconductive thereby producing an improved superconducting shield.

8. The improved radiation shield according to claim 7, and further comprising that:
   said ribbon means and said end sealing means are composed of niobium stannide.